(12) United States Patent
Shin et al.

(10) Patent No.: US 7,732,317 B2
(45) Date of Patent: Jun. 8, 2010

(54) METHODS OF FORMING CONTACT STRUCTURES FOR MEMORY CELLS USING BOTH ANISOTROPIC AND ISOTROPIC ETCHING

(75) Inventors: Hyun-Chul Shin, Seoul (KR);
Jeong-Ho Park, Gyeonggi-do (KR);
Jung-Young Lee, Gyeonggi-do (KR);
Kwang-Won Park, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 806 days.

(21) Appl. No.: 10/899,226

(22) Filed: Jul. 26, 2004

(65) Prior Publication Data
US 2005/0140002 A1      Jun. 30, 2005

(30) Foreign Application Priority Data
Dec. 30, 2003   (KR) ...................... 10-2003-0100489

(51) Int. Cl.
*H01L 21/4763* (2006.01)
(52) U.S. Cl. ........................ 438/597; 438/637; 438/638; 438/639; 257/E21.577
(58) Field of Classification Search ................. 438/597, 438/706, 710–713, 723, 637; 257/E21.577
See application file for complete search history.

(56) References Cited

U.S. PATENT DOCUMENTS

| | | | |
|---|---|---|---|
| 5,275,972 A * | 1/1994 | Ogawa et al. ............... 438/624 |
| 5,885,895 A * | 3/1999 | Liu et al. ..................... 438/637 |
| 6,197,639 B1 | 3/2001 | Lee et al. ..................... 438/258 |
| 6,242,331 B1 * | 6/2001 | Chu et al. .................... 438/586 |
| 6,306,713 B1 * | 10/2001 | Hu et al. ...................... 438/299 |
| 6,551,923 B1 | 4/2003 | Shields et al. ............... 438/637 |
| 6,967,150 B2 * | 11/2005 | Yun et al. .................... 438/586 |
| 7,084,508 B2 * | 8/2006 | Eimori ....................... 257/774 |
| 2003/0119253 A1* | 6/2003 | Parekh et al. ............... 438/255 |
| 2006/0270249 A1* | 11/2006 | Asakawa et al. ............ 438/783 |

FOREIGN PATENT DOCUMENTS

| JP | 2003-023117 | 1/2003 |
|---|---|---|
| KR | 1020010077518 | 8/2001 |
| KR | 1020020067798 | 8/2002 |

OTHER PUBLICATIONS

Wolf, silicon processing for the VLSI ERA, 1986, vol. 1, pp. 521-523.*

* cited by examiner

*Primary Examiner*—Thanh Nguyen
(74) *Attorney, Agent, or Firm*—Myers Bigel Sibley & Sajovec

(57) ABSTRACT

Methods of forming a cell of a NOR-type flash memory device are provided in which a first gate pattern having a first sidewall and a second gate pattern having a second sidewall that opposes the first sidewall are formed on a semiconductor substrate. A source/drain region is formed in the semiconductor substrate between the first and second gate patterns. An etch stop layer is formed on the first and second sidewalls that defines a gap region. A dielectric layer is formed in the gap region, and is then etched to form a contact hole. Finally, a conductive material is deposited in the contact hole.

26 Claims, 15 Drawing Sheets

METHODS OF FORMING CONTACT STRUCTURES FOR MEMORY CELLS USING BOTH ANISOTROPIC AND ISOTROPIC ETCHING

CLAIM OF PRIORITY

This application claims priority from Korean Patent Application No. 10-2003-100489, filed on Dec. 30, 2003, the disclosure of which is hereby incorporated herein in its entirety by reference.

FIELD OF THE INVENTION

The present invention relates to methods of forming memory devices, and more particularly, to methods of forming memory device contact structures and related memory devices.

BACKGROUND

The cell array of a NOR-type flash memory device includes a plurality of memory cells in the row and column directions, and bit-line contacts for accessing each memory cell. U.S. Pat. No. 6,197,639 titled "Method for Manufacturing NOR-Type Flash Memory Device" describes a method of forming a bit-line contact for a NOR-type flash memory device using a self-aligned contact ("SAC").

FIGS. 1-3 are cross-sectional views illustrating a conventional method of forming a NOR-type flash memory cell.

Referring to FIG. 1, a field isolation layer 12 is formed at a semiconductor substrate 10 to define an active region 14. A tunnel oxide layer 16 is formed on the active region 14 and a plurality of gate patterns 26 are formed on the tunnel oxide layer 16. Each of the gate patterns 26 comprises a floating gate 18, an inter-gate dielectric layer 20, a control gate electrode 22 and a capping layer 24 that are sequentially stacked. Impurities are implanted into the active region 14 between the gate patterns 26, thereby forming a source region 32s and a drain region 32d. A spacer pattern 28 is formed on the sidewalls of the gate pattern 26, and a planarized interlayer dielectric layer 30 is formed over the surface of the semiconductor substrate 10. The spacer pattern 28 and the interlayer dielectric layer 30 are formed of materials that have etch selectivity with respect to each other.

As shown in FIG. 2, the interlayer dielectric layer 30 is patterned to form contact holes exposing the source region 32s and the drain region 32d. During the patterning, the spacer pattern 28 acts as an etch stopping layer. Thus, the contact hole 34 is self-aligned by the spacer pattern 28. Then, as shown in FIG. 3, the contact holes 34 are filled with a conductive material to form a source contact pattern 36s connected to the source region 32s and a drain contact pattern 36d connected to the drain region 32d.

FIG. 4 is depicts a cell array of a conventional NOR-type flash memory device. As shown in FIG. 4, the cell array includes a plurality of data blocks 00, 01, . . . 0n, . . . , n0, n1, . . . nn. Each of the data blocks includes a plurality of memory cells that are arranged in rows and columns. A plurality of parallel word lines WL are provided that run in the row direction, and a plurality of parallel bit lines BL are provided that run in the column direction. Each memory cell is connected to one of the word lines and one of the bit lines. In a NOR-type flash memory device, a specific word line and a specific bit line may be selected to access a specific memory cell. Thus, reading operations can be independently performed on a specific memory cell. However, in order to reduce the operation time, erase operations are performed by data block. In particular, the erase operation is performed simultaneously on all of the memory cells of a particular data block after pre-programming the data block. However, because the memory cells typically are not structurally uniform, the memory cells may not erase uniformly, and a single erase pulse may fail to successfully erase every memory cell in the data block. Consequently, to erase the memory cells in a data block, the erase operation (and verification thereof) is typically performed a predetermined number of times. As the number of times the erasing and verification operations are performed becomes large, so does the time required to erase the data block.

SUMMARY OF THE INVENTION

In certain embodiments of the present invention, methods are provided for forming a contact structure for a memory cell in which first and second spaced apart gate patterns are formed on a substrate. An etch stop layer is formed on at least a first sidewall of the first gate pattern and a second sidewall of the second gate pattern. The etch stop layer on the first and second sidewalls may define a gap therebetween. An interlayer dielectric layer is formed on the etch stop layer, and then is anisotropically etched to form a preliminary contact hole that has a width that is narrower than the width of the gap. At least one sidewall of the preliminary contact hole is isotropically etched to form a contact hole, and then a conductive material is deposited in the contact hole to form a contact plug that is electrically connected to the substrate.

In certain embodiments of the present invention, the etch stop layer may form at least part of the sidewalls of the contact hole. Additionally, the isotropic etching may have a higher etch selectivity of the etch stop layer with respect to the interlayer dielectric layer than does the anisotropic etching. The first gate pattern may comprise a tunnel oxide layer, a floating gate, an inter-gate dielectric layer and a control gate pattern that are sequentially stacked on the substrate.

In further embodiments of the present invention, the etch stop layer may further be formed on the substrate between the first gate pattern and the second gate pattern. In these embodiments, the method may further comprise removing the etch stop layer between the first gate pattern and the second gate pattern to expose the substrate after forming the contact hole. This removing step may, for example, comprise conformally forming a spacer insulation layer of the same material as the etch stop layer on the substrate and then anisotropically etching the spacer insulation layer and the etch stop layer to expose the substrate under the contact hole.

In still further embodiments of the present invention, a spacer insulation layer may be formed on the first and second sidewalls. The etch stop layer may be formed of a material having an etch selectivity with respect to the spacer insulation layer. In specific embodiments, the etch stop layer may be formed by forming a spacer insulation layer on the sidewalls of the first gate pattern and the second gate pattern and then forming an etch stop layer having an etch selectivity with respect to the spacer insulation layer on the spacer insulation layer. In such embodiments, the method may further comprise removing the etch stop layer under the contact hole to expose the substrate after forming the contact hole.

In still further embodiments of the present invention, methods of forming a cell of a memory device are provided in which a first gate pattern having a first sidewall and a second gate pattern having a second sidewall that opposes the first sidewall are formed on a semiconductor substrate. A source/drain region is also formed in the semiconductor substrate between the first and second gate patterns. An etch stop layer is formed on the first and second sidewalls. This etch stop layer may define a gap region that is located over the source/drain region. A dielectric layer is formed in the gap region, and then is etched to form a contact hole. Finally, a conductive material is deposited in the contact hole.

In these embodiments, the dielectric layer may first be etched using an anisotropic etch process to form a preliminary contact hole, and then the sidewalls of this preliminary contact hole may be isotropically etched to form the contact hole. The isotropic etch of the preliminary contact hole may expose at least part of the etch stop layer on the first sidewall and at least part of the etch stop layer on the second sidewall, and the width of the preliminary contact hole may be less than the width of the gap region. The etch stop layer may comprise a first spacer on the first sidewall and a second spacer on the second sidewall. A spacer insulation layer may also be formed on the etch stop layer, either before or after formation of the preliminary contact hole. The step of etching the dielectric layer may comprise forming a preliminary contact hole followed by recessing the sidewalls of the preliminary contact hole to form the contact hole.

Methods of forming a contact for a memory device are also provided in which a portion of a dielectric layer positioned over a source/drain region in a substrate is anisotropically etched to form a preliminary contact hole. A further portion of the dielectric layer is then isotropically etched to form a final contact hole. Finally, a conductive material is deposited in the contact hole to form the contact. In these embodiments an etch stop layer may be formed prior to performing the anisotropic etch, where the etch stop layer is used to at least partly define the extent of the isotropic etch.

In still other embodiments of the present invention, intermediate structures are provided that are formed during the manufacture of a memory device. These structures may comprise first and second spaced apart gate patterns on a semiconductor substrate, a source/drain region in the semiconductor substrate between the first and second gate patterns, an etch stop layer on a first sidewall of the first gate pattern and on a second sidewall of the second gate pattern that defines a gap region, a dielectric layer in the gap region and a preliminary contact hole in the dielectric layer. The width of the preliminary contact hole may be less than the width of the gap region. The intermediate structure may further comprise a photoresist mask on the dielectric layer that has an opening positioned over the gap region that is smaller than the gap region.

In still further embodiments of the present invention, memory devices are provided that have first and second spaced apart gate patterns on a semiconductor substrate, a source/drain region on the semiconductor substrate between the first and second gate patterns, a first spacer on a first sidewall of the first gate pattern and a second spacer, that faces the first spacer, on a second sidewall of the second gate pattern, a spacer insulation layer on the first spacer and the second spacer, and a conductive material between the spacer insulation layer on the first spacer and the spacer insulation layer on the second spacer that electrically connects to the source/drain region.

DETAILED DESCRIPTION

Figure 1:
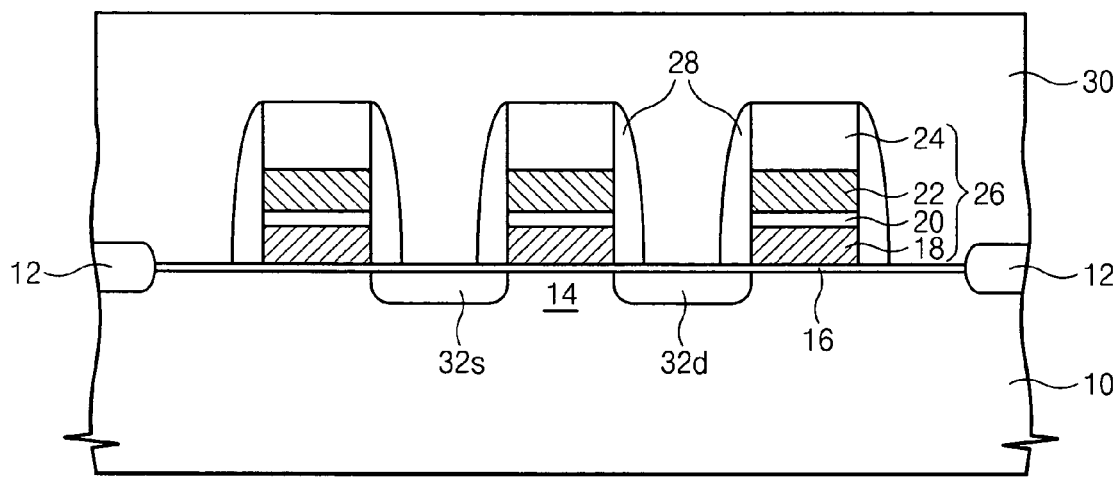
FIGS. 1-3 are cross-sectional views illustrating a conventional method of forming a NOR-type flash memory cell.
Figure 2:
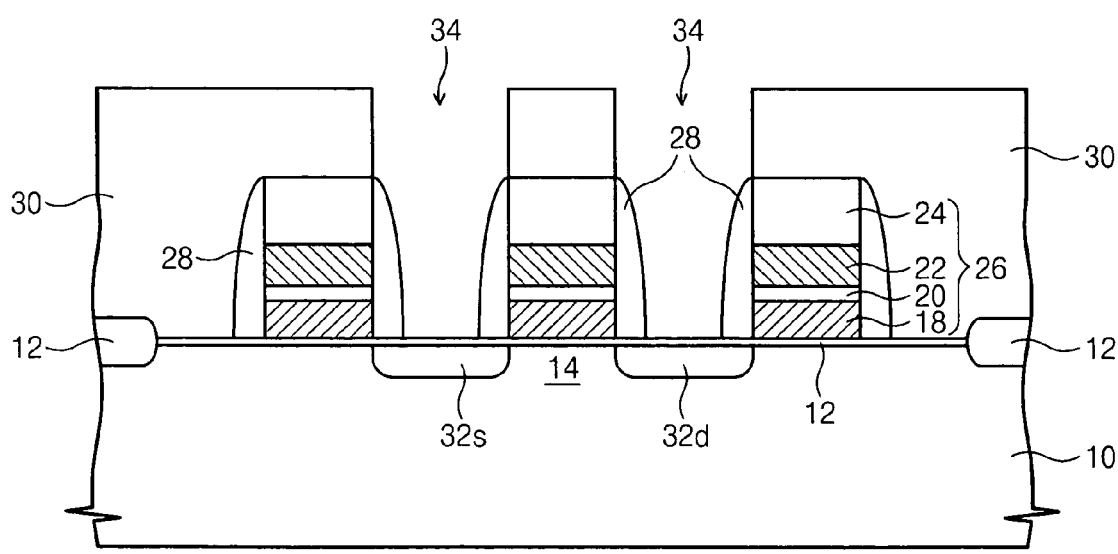
Figure 3:
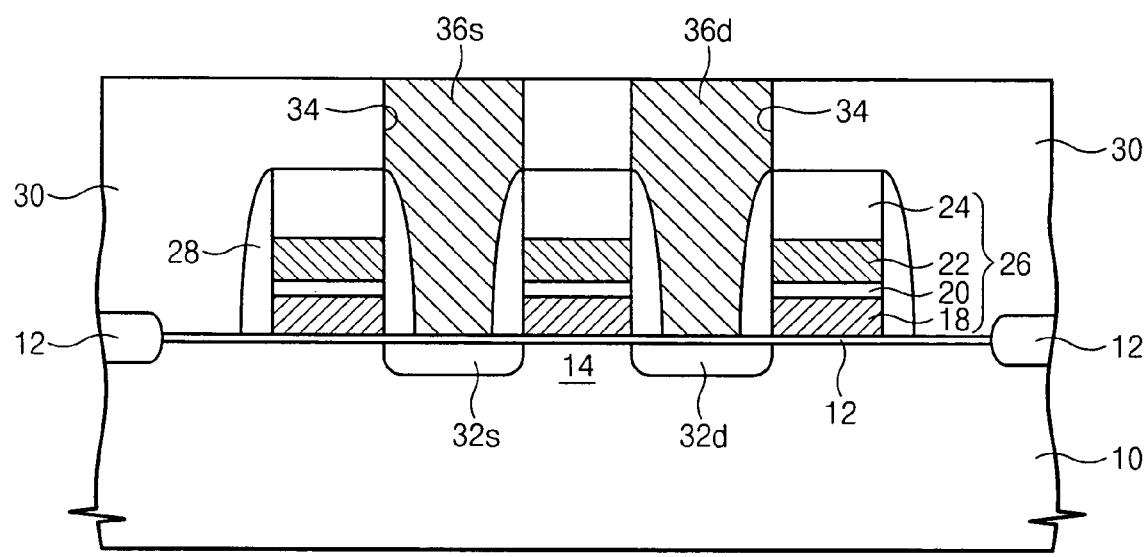
Figure 4:
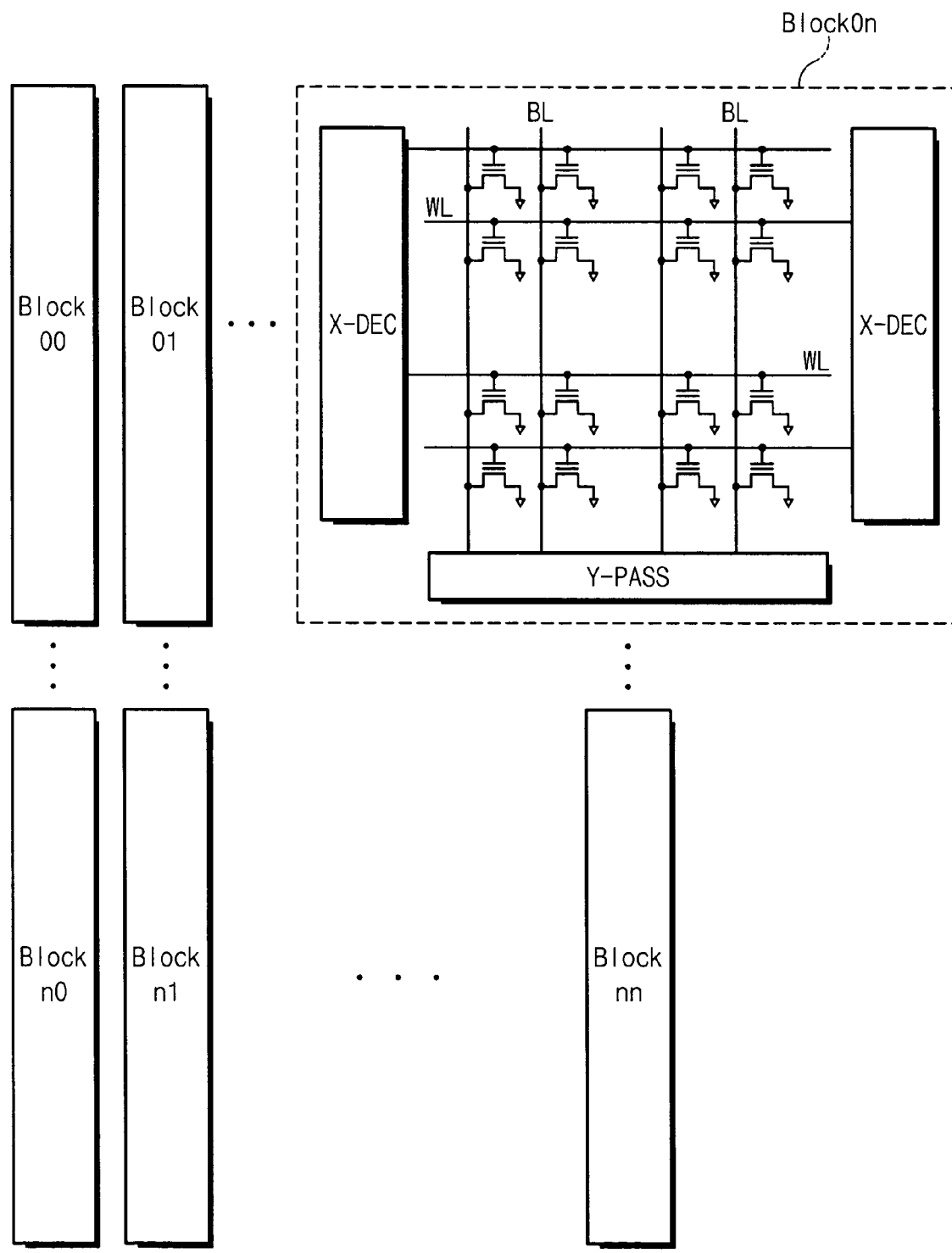
FIG. 4 is a drawing of a cell array of a NOR-type flash memory device.

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity. Like numbers refer to like elements throughout.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" may be used herein to describe a relationship of one element, layer or region to another element, layer or region as illustrated in the figures. It will be understood that these terms are intended to encompass different orientations of the device in addition to the orientation depicted in the figures.

As used herein, the term "and/or" includes any and all combinations of one or more of the associated listed items.

It will be understood that, although the terms first, second, etc. may be used herein to describe various elements, these elements should not be limited by these terms. These terms are only used to distinguish one element from another. For example, a first layer could be termed a second layer, and, similarly, a second layer could be termed a first layer without departing from the teachings of the disclosure.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used herein, specify the presence of stated features, integers, steps, operations, elements, and/or components, but do not preclude the presence or addition of one or more other features, integers, steps, operations, elements, components, and/or groups thereof.

It also will be understood that, as used herein, the terms "row" and "column" indicate two non-parallel directions that may be orthogonal to one another. However, the terms row and column do not indicate a particular horizontal or vertical orientation.

Embodiments of the invention are described herein with reference to cross-section illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. For example, an implanted region illustrated as a rectangle will, typically, have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of the invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense expressly so defined herein.

Figure 5:
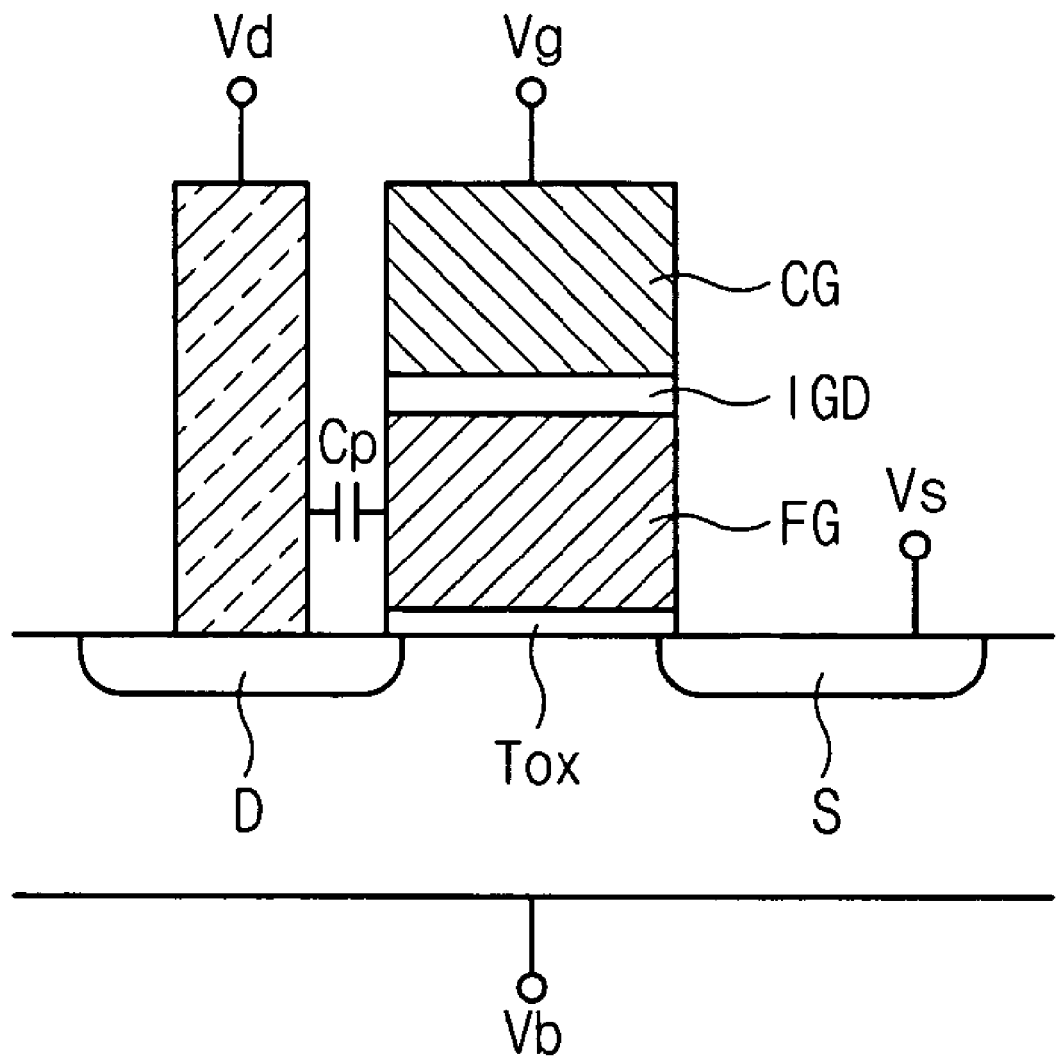
FIG. 5 is a cross-sectional view of a memory cell of a conventional NOR-type flash memory device.

FIG. 5 is a cross-sectional view of a memory cell of a conventional NOR-type flash memory device. As shown in FIG. 5, the memory cell has a gate pattern that includes a tunnel oxide layer Tox, a floating gate FG, an inter-gate dielectric layer IGD and a control gate CG that are stacked on a substrate. A source region S and a drain region D are formed in the substrate on respective sides of the gate pattern. To execute an erase operation, a gate voltage Vg of, for example, about −10 volt is applied to the gate pattern and a substrate voltage Vb of, for example, about 8 volt is applied to the substrate. The voltages applied to the source Vs and drain Vd may be floated. The memory cell is erased by a Fowler-Nordheim tunneling effect due to the electric potential difference on both sides of the tunnel oxide Tox. The electric potential difference is determined by the voltage coupled to the floating gate FG and the substrate. Although the Fowler-Nordheim tunneling through the tunnel oxide should theoretically occur due to the electric potential difference between the coupled gate voltage and the substrate voltage, sometimes, a memory cell is not erased. This failure to erase may occur, for example, because the substrate voltage is boosted by the drain electrode.

As illustrated in FIG. 5, since the drain electrode is floated, the drain voltage is boosted. The boosted drain voltage may be coupled to the floating gate via a parasitic capacitance between the drain electrode (the drain contact pattern) and the floating gate. This may act to reduce the overall voltage coupled to the floating gate which, in turn, may result in a slower erase or a failure to erase altogether.

Figure 6:
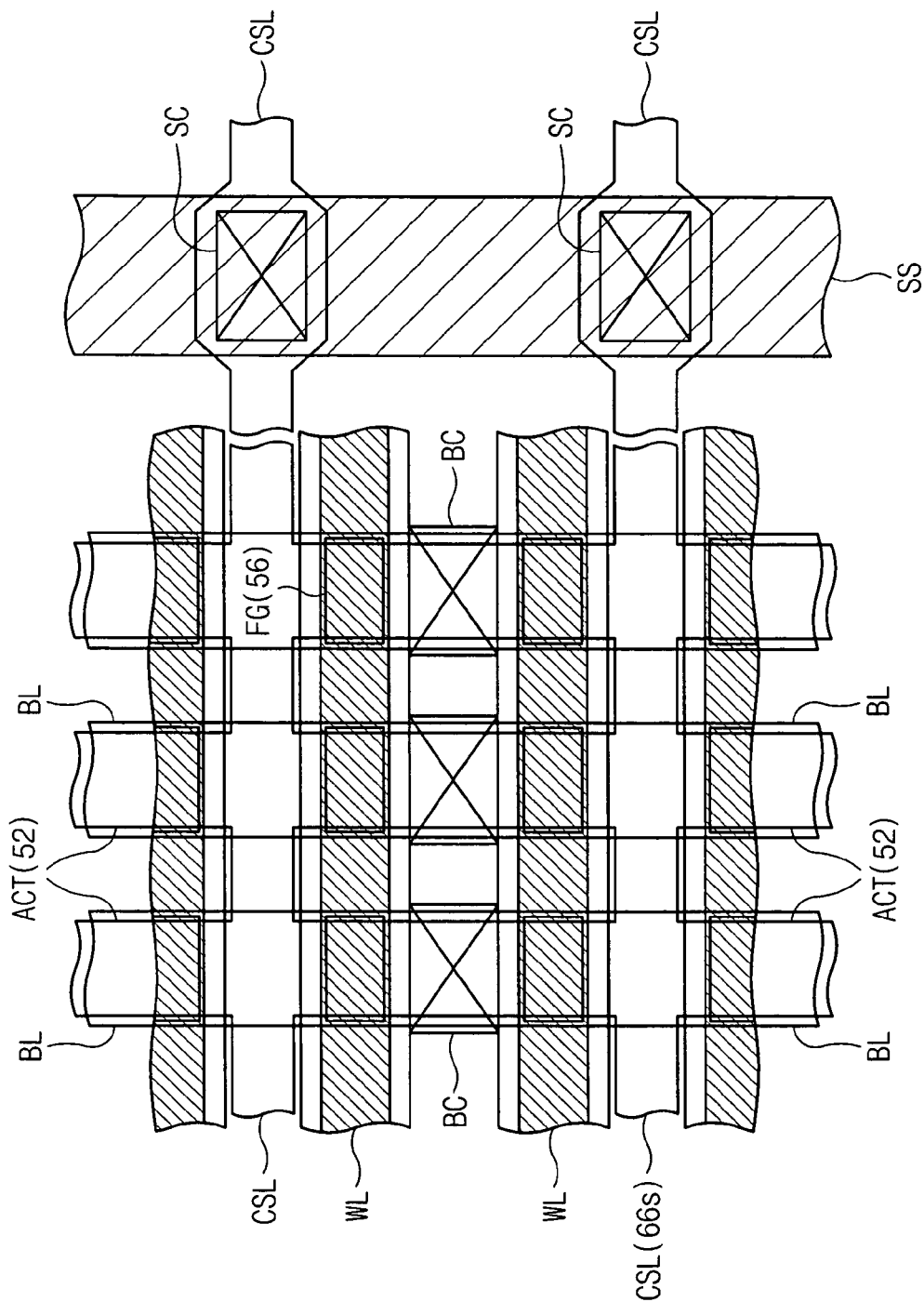
FIG. 6 is a plan view of a NOR-type flash memory cell array.

FIG. 6 is a plan view of a NOR-type flash memory cell array according to certain embodiments of the present invention. As illustrated in FIG. 6, the NOR-type memory cell array includes a plurality of active regions ACT and gate patterns (i.e., word lines WL) that cross over the active regions ACT. A floating gate FG is formed at the intersections between the word line WL and the active regions ACT. The word line WL is adjacent to a common source line CSL in a first direction and adjacent to a drain contact (i.e., a bit-line contact plug BC) in another direction. The common source line CSL is extended on the substrate in the same direction as the word lines and includes a region where a source contact (i.e., a source strapping contact plug SC) is formed. A bit line BL and a source strapping SS are disposed to cross over the word lines WL. The bit lines BL are connected to the bit line contact plug BC and the source strapping SS is connected to the source strapping contact plugs SC.

Figure 7:
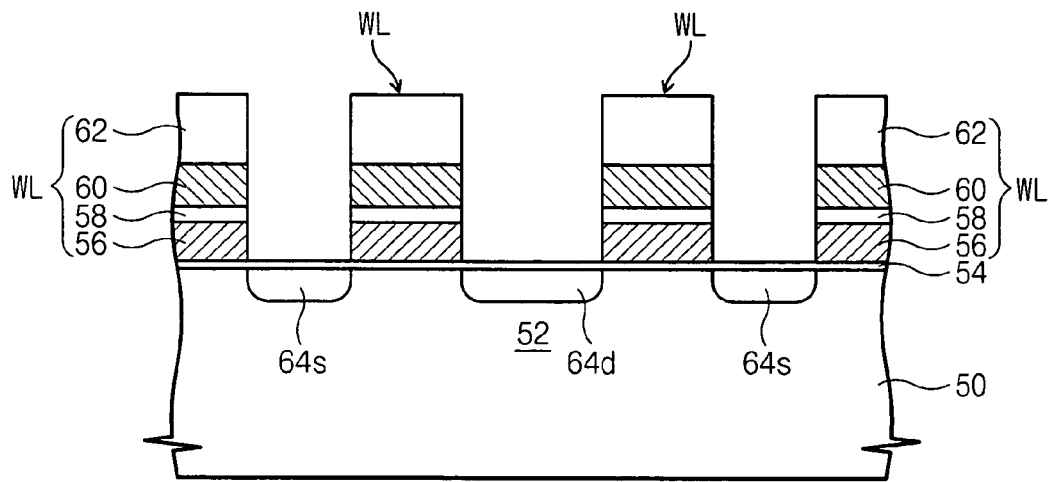
FIGS. 7-9, 10A and 11A are cross-sectional views illustrating methods of forming contact structures for NOR-type flash memory devices according to certain embodiments of the present invention.

FIGS. 7-9, 10A and 11A are cross-sectional views illustrating methods of forming contact structures for NOR-type flash memory devices according to certain embodiments of the present invention. Referring to FIG. 7, a field isolation layer (not shown) is formed on a substrate 50 to define an active region 52. A tunnel oxide layer 54 is formed on the active region 52 and a gate pattern (i.e., a word line WL) is formed on the tunnel oxide layer 54. The gate pattern WL includes a floating gate 56, an inter-gate dielectric layer 58 and a control gate electrode 60. The control gate electrode 60 may cross over a plurality of active regions 52, and each of the floating gates 56 is formed to be separated on each of the active regions. A capping layer 62 may be formed on the control gate electrode 60. The capping layer 62 may be formed, for example, of silicon oxide, silicon nitride or silicon oxynitride or a combination thereof.

As used herein, the term "gate pattern" refers to any individual gate electrode structure that is formed on the semiconductor substrate. It will be appreciated that, in practical devices, an array of such gate structures may be formed. As discussed above, in certain embodiments of the present invention the gate patterns may comprise a floating gate, an inter-gate dielectric layer and a control gate. In these embodiments, a single control gate may be part of multiple gate patterns.

Figure 8:
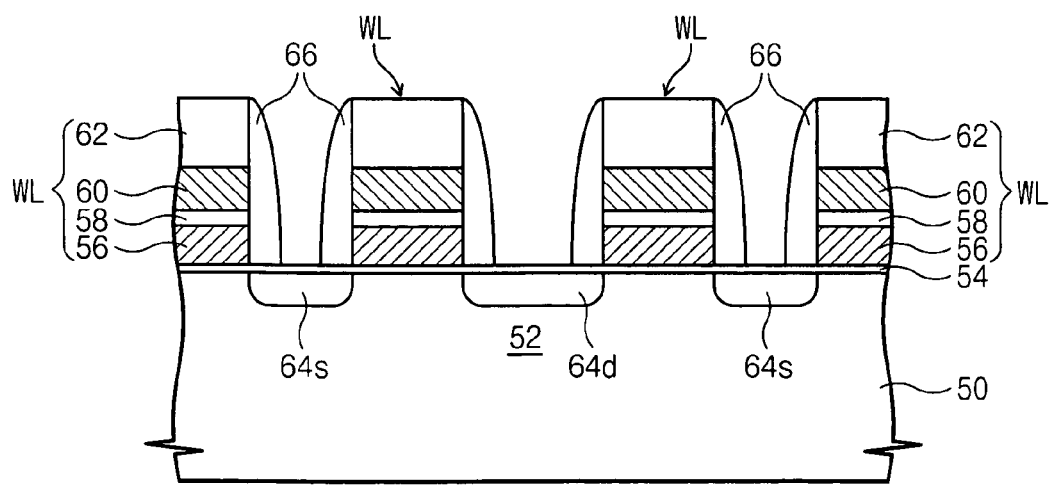

As shown in FIG. 8, a source region 64s and a drain region 64d are formed in the active region on respective sides of the gate pattern WL. Herein, both the source region 64s and the drain region 64d are also more generically referred to as a "source/drain region," which is a term used to refer to either a source region 64s or a drain region 64d. The source region 64s and the drain region 64d are formed by implanting impurities into the substrate. Before the impurities are implanted, part of the field isolation layer between the gate patterns may be removed to extend the source region 64s to be parallel to the gate pattern. Spacer patterns 66 are formed at sidewalls of the gate pattern WL. The spacer patterns 66 may be formed of a material having an etch selectivity with respect to an interlayer dielectric layer, such as, for example, silicon nitride so that the spacer pattern 66 may act as an etch stop layer with respect to the interlayer dielectric layer. A gap may exist between the spacer patterns 66 over the drain region 64d. Another gap may exist between the spacer patterns at the source strapping region. Prior to forming the spacer patterns

66, a silicon oxide layer (not shown in FIG. 8) may be formed at a sidewall of the gate pattern WL.

Figure 9:
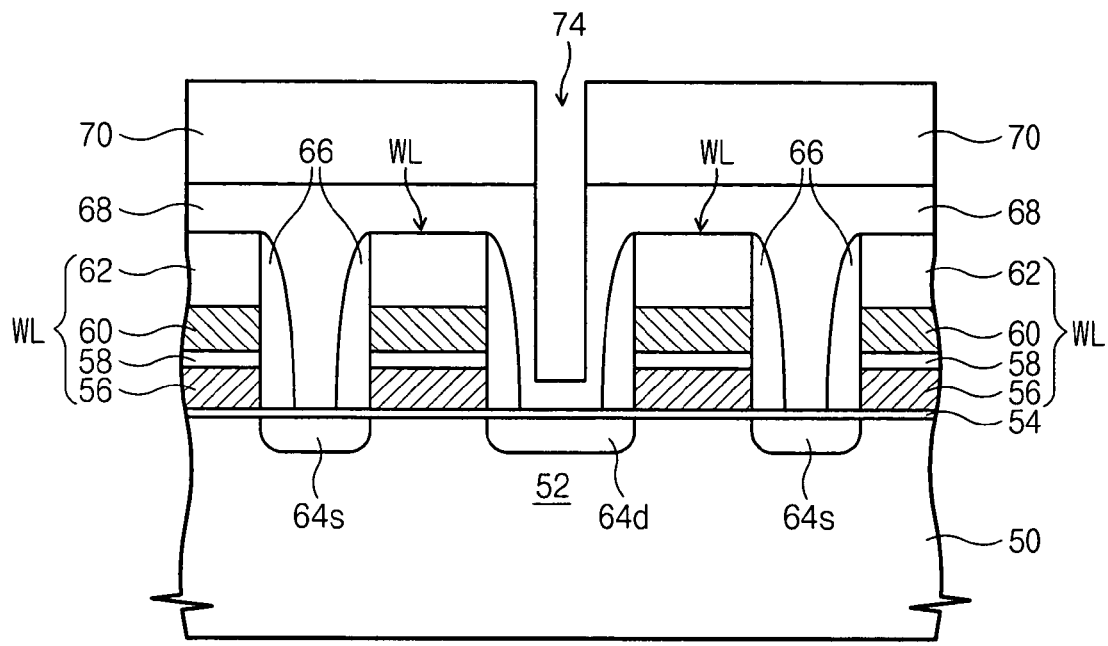

As shown in FIG. 9, a planarized interlayer dielectric layer 68 is formed on the surface of the substrate having the spacer patterns 66. The interlayer dielectric layer 68 may be formed of, for example, silicon oxide. A photoresist pattern 70 is formed to define contact holes in the interlayer dielectric layer 68. The contact holes corresponding to the bit-line contact plug BC and the source strapping contact plug SC in FIG. 6. The contact holes may have a narrower diameter (or other shape) than the width of the gap between the spacer patterns 66.

Part of the interlayer dielectric layer 68 is anisotropically etched using the photoresist pattern 70 as an etch mask to from a preliminary contact hole 74. The width of the preliminary contact hole 74 is narrower than the width of the gap between the spacer patterns 66.

Figure 10A:
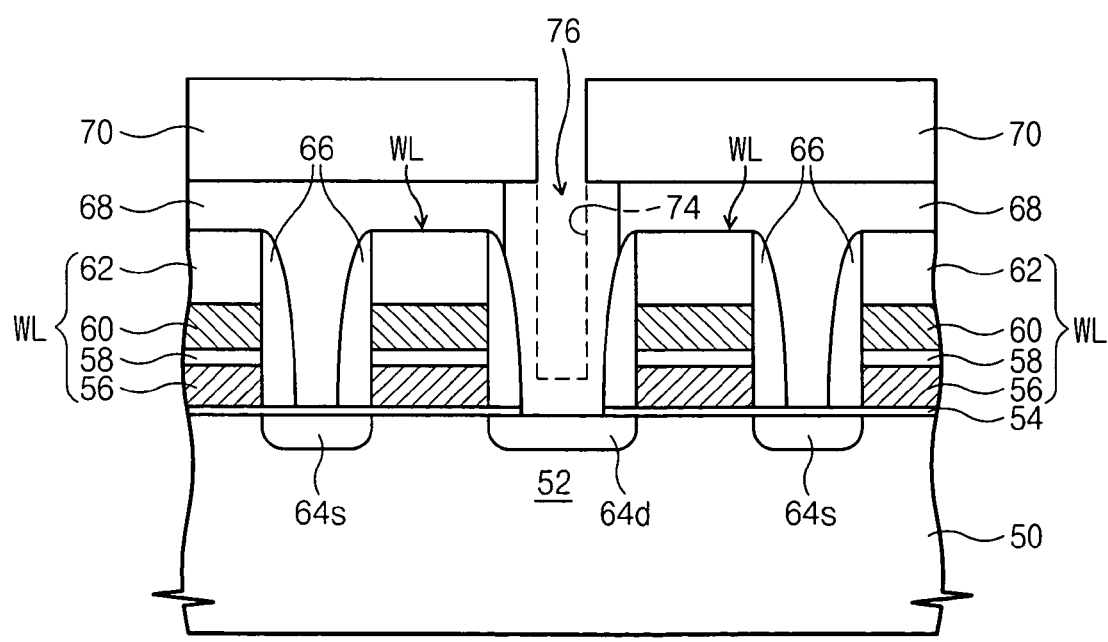

As shown in FIG. 10A, the interlayer dielectric layer 68 may be isotropically etched using the photoresist pattern 70 as an etch mask to expose the active region 52. Through this etching process, the sidewalls of the preliminary contact hole 74 may be recessed to form a contact hole 76 that exposes the two facing spacer patterns 66. The isotropic etch provides a higher etch selectivity of the interlayer dielectric layer with respect to the spacer patterns 66 than does the anisotropic etch.

During a photolithography process, misalignment of the photoresist pattern may occur. If such misalignment occurs during conventional methods of forming a self-aligned contact, the distance between the contact plug and the gate pattern adjacent to the contact plug may be changed. When this occurs, the sidewall spacer pattern in one direction may be exposed, but the sidewall spacer pattern in another direction is not exposed and the interlayer dielectric layer remains between the contact hole and the sidewall spacer. As illustrated in FIG. 5, the parasitic capacitance between the contact plug and the floating gate pattern may have a material affect on the erasing operation. If the contact plug is shifted, it may change the voltage coupled to the floating gates at both sides thereof. This may result in memory cells that are more difficult to erase.

In contrast, the interlayer dielectric layer 68 with the preliminary contact hole 74 in the memory device of FIG. 10A is isotropically etched to form a contact hole 76 that exposes the two facing spacer patterns 66. Since the spacer patterns 66 have an etch selectivity with respect to the interlayer dielectric layer 68, the interlayer dielectric layer 68 can be isotropically etched until the spacer patterns 66 on the sidewalls of the floating gates 56 are more uniformly exposed. Thus, even in instances where the photoresist pattern 70 is misaligned, the isotropic etch may make it possible to expose both of facing spacer patterns 66. As a result, the distance from the contact hole 76 to the floating gate 56 can be made more uniform throughout the cell array. Since the voltage that is coupled to the floating gate during the erasing operation is related to the parasitic capacitance between the floating gate and the contact plug, the impact of the misalignment of the photoresist pattern on the erasing operation may be reduced or minimized. In the above-described embodiments of the present invention, the capping layer 62 may be formed of a material having an etch selectivity with respect to the interlayer dielectric layer 68. For example, the capping layer 62 may include the same material as the spacer pattern 66.

Figure 11A:
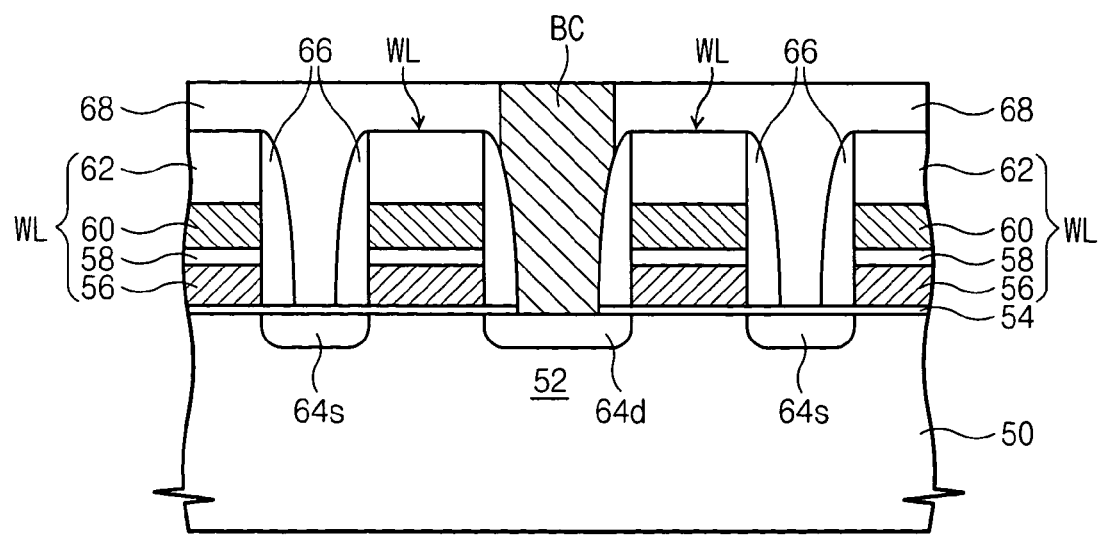

As shown in FIG. 11A, the contact hole 76 is filled with a conductive material to form a bit-line contact plug BC. As illustrated in FIG. 6, a source strapping contact plug SC is formed at the source strapping region.

Figure 10B:
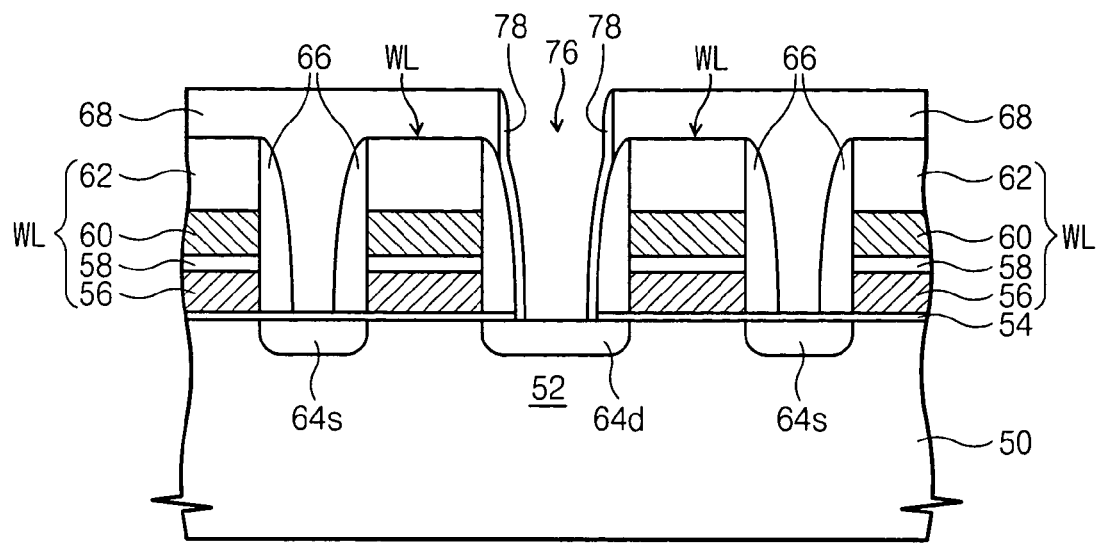
FIGS. 10B and 11B are cross-sectional views illustrating modified examples of the NOR-type flash memory devices depicted in FIGS. 10A and 11A.
Figure 11B:
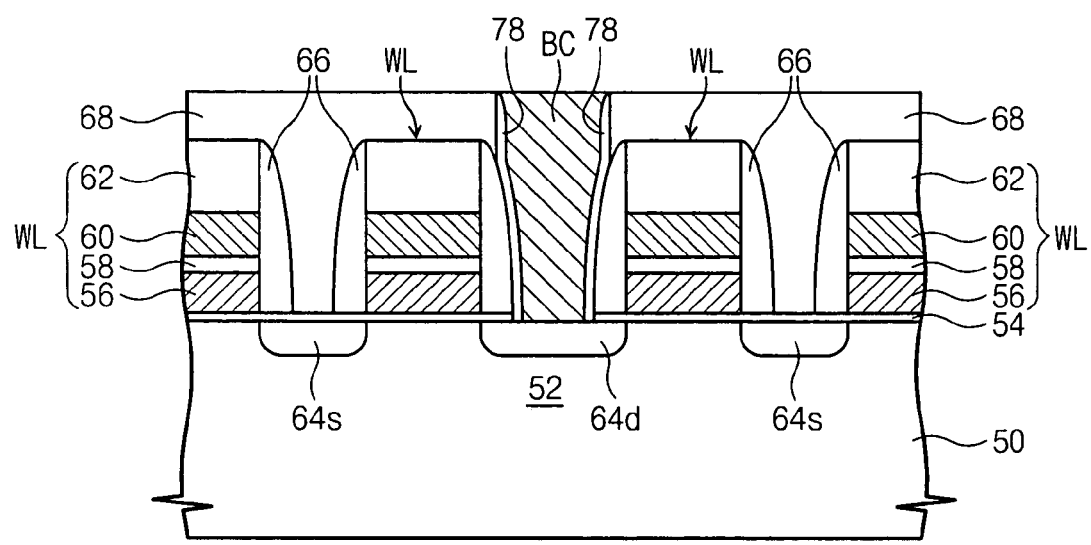

FIGS. 10B and 11B are cross-sectional views illustrating a modified version of the NOR-type flash memory device depicted in FIGS. 10A and 11A. As shown in FIG. 10B, the interlayer dielectric layer 68 having the preliminary contact hole 74 is isotropically etched to form the contact hole 76, and the photoresist pattern 70 is removed. A spacer insulation layer 78 is formed of a material having an etch selectivity with respect to the interlayer dielectric layer 68. The spacer insulation layer 78 may be formed of the same material as the spacer patterns 66. The spacer insulation layer 78 is anisotropically etched to expose an active region. The spacer insulation layer 78 may remain at the sidewalls of the contact hole 76.

As shown in FIG. 11B, a conductive material is formed in the contact hole 76 to form a bit-line contact plug BC. As illustrated in FIG. 6, a source strapping contact plug SC is formed at the source strapping region. The spacer insulation layer 78 may act to lower the parasitic capacitance between the bit-line contact plug BC and the floating gate pattern WL. The spacer insulation layer 78 may also help prevent the plug from being shorted with the control gate electrode 60, which may occur as a result of the etch of the spacer pattern.

FIGS. 12-15 and 16A are cross-sectional views illustrating methods of forming contact structures for NOR-type flash memory devices according to further embodiments of the present invention.

Figure 12:
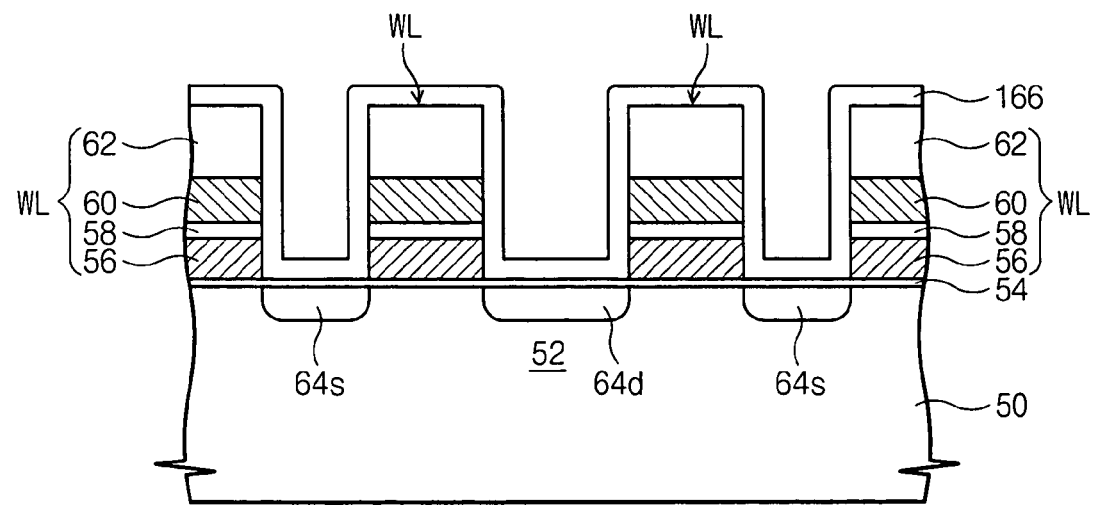
FIGS. 12-15 and 16A are cross-sectional views illustrating methods of forming contact structures for a NOR-type flash memory devices according to further embodiments of the present invention.

As shown in FIG. 12, an active region 52 is defined on a substrate 50 and a tunnel oxide layer 54 is formed on the active region 52. A gate pattern WL is formed over the active region. The gate pattern WL includes a floating gate 56, an inter-gate dielectric layer 58 and a control gate electrode 60. The control gate electrode 60 crosses over a plurality of active regions 52. Each of the floating gates 56 is separated on each of the active regions 52 that are intersected with the control gate electrode 60. A capping layer 62 may be formed on the control gate electrode 60.

Impurities may be implanted into the active region 52 between the gate patterns WL to form source regions 64s and drain regions 64d. Part of the field isolation layer (not shown in FIG. 12) between the gate patterns WL may be removed before the impurities are implanted so that the source regions 64s may extend to be parallel to the gate patterns WL. The source regions 64s include source strapping regions that are spaced apart from each other. An etch stopping layer 166 is conformally formed on the resultant structure. A gap defined by the etch stopping layer 166 may exist over the drain region 64d. A gap (not shown in FIG. 12) may also be defined by the etch stopping layer 166 at the source strapping region. The etch stopping layer 166 may be formed of a material having an etch selectivity with respect to the interlayer dielectric layer 168 (see FIG. 13) such as, for example, silicon nitride. A silicon oxide layer may be formed to cover sidewalls of the gate pattern WL before the formation of the etch stopping layer 166.

Figure 13:
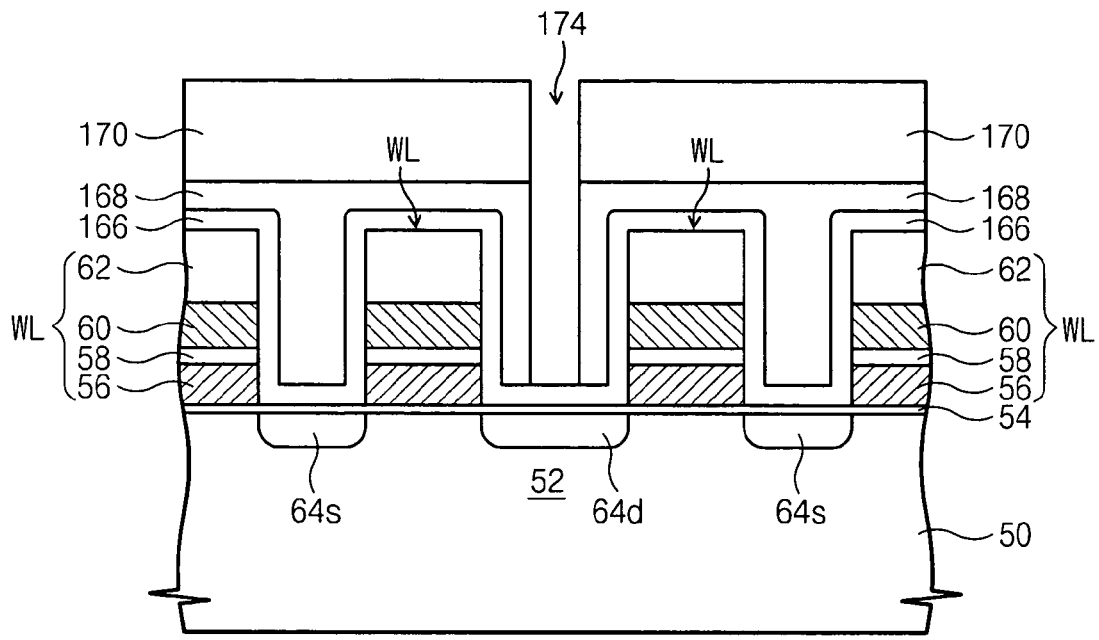

As shown in FIG. 13, a planarized interlayer dielectric layer 168 is formed on the etch stopping layer 166. As noted above, the interlayer dielectric layer 168 may be formed of a material having an etch selectivity with respect to the etch stopping layer 166. For example, if the etch stopping layer 166 is formed of silicon nitride, the interlayer dielectric layer 168 may be formed of silicon oxide. A photoresist pattern 170 defining a contact hole is formed on the interlayer dielectric layer 168. The width of the contact hole is narrower than the width of the gap formed by the etch stopping layer 166 over the drain region 64d and the source strapping region.

As is also shown in FIG. 13, the interlayer dielectric layer 168 is etched using the photoresist pattern 170 as an etch mask to form a preliminary contact hole 174. The preliminary contact hole 174 has a narrower width than the gap defined by the etch stopping layer 166. Since the interlayer dielectric layer 168 is formed on the etch stopping layer 166, anisotropic etching of the interlayer dielectric layer 168 may be performed using the etch stopping layer 166 as an etch mask. As noted above, the photoresist pattern 170 may be misaligned over certain memory cells, which acts to shift the preliminary contact hole 174 away from the center of the drain region 64d.

Figure 14:
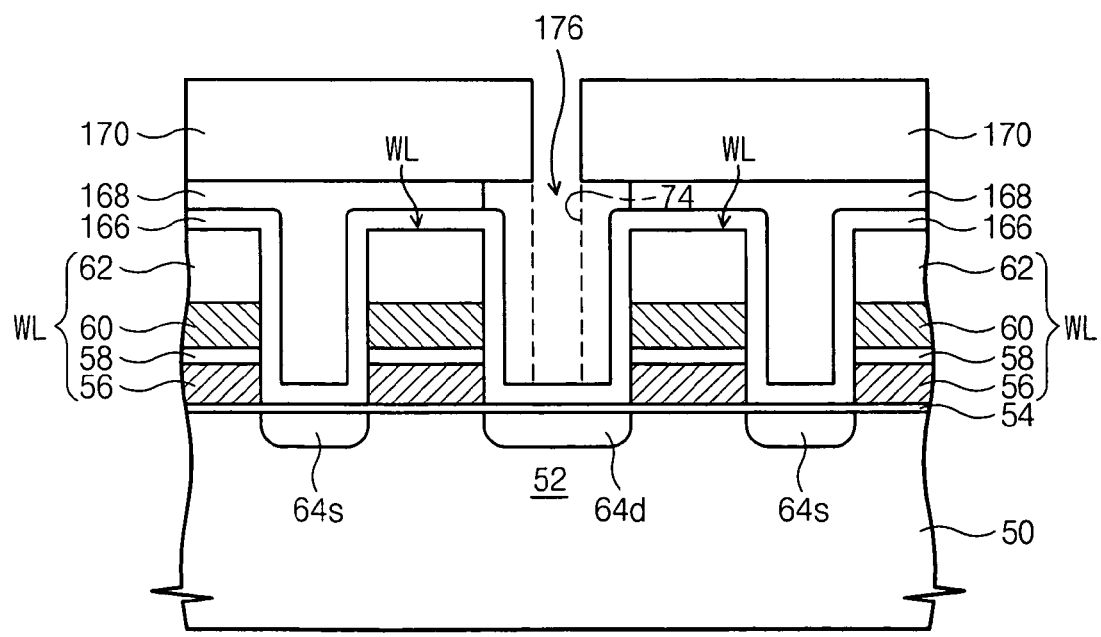

As shown in FIG. 14, the interlayer dielectric layer 168 may be isotropically etched using the photoresist pattern 170 as an etch mask to form the contact hole 176.

The contact hole 176 may expose the etch stopping layer 166 at the sidewalls of the gate pattern WL. Even in situations where the preliminary contact hole 174 discussed above with reference to FIG. 13 is shifted off-center due to misalignment of the photoresist pattern 170, the contact hole 176 may expose the etch stopping layer 166 at both sides of the contact hole 176 due to the isotropic etch process. Since the etch stopping layer 166 acts as an etch stopper in the isotropic etch process, the distance between each contact hole 176 and the neighboring floating gate may be more uniform throughout the cell array.

Figure 15:
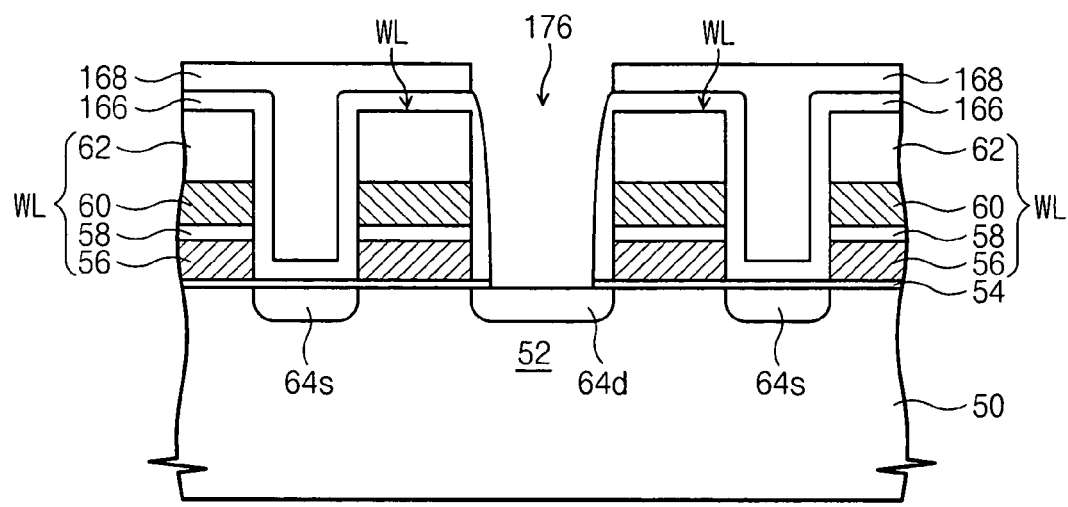

As shown in FIG. 15, the photoresist pattern 170 is removed and the portions of the etch stopping layer 166 that are within the contact hole 176 may be anisotropically etched to expose the drain region 64d. Although not illustrated in FIG. 15, the source region 64s may similarly be exposed at the source strapping region.

Figure 16A:
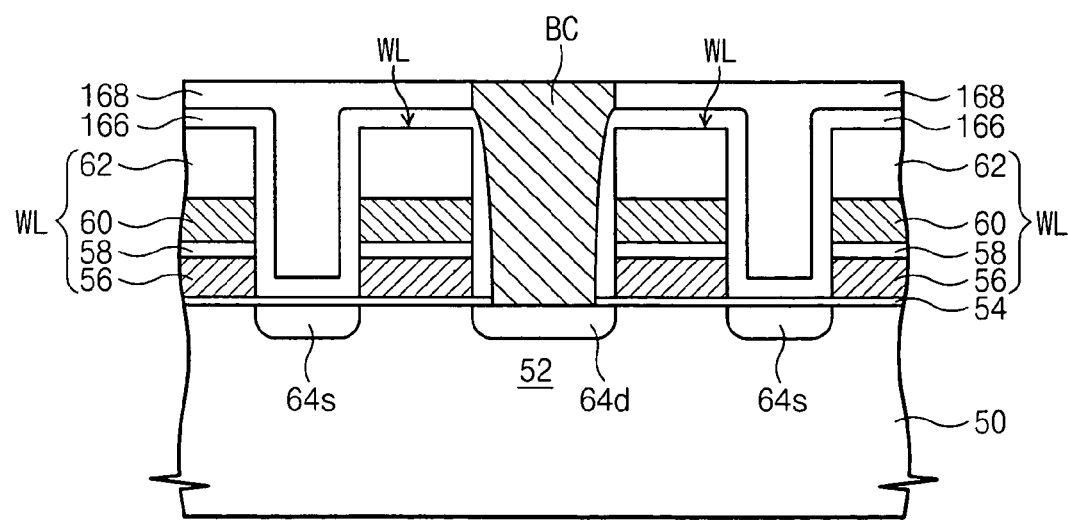

As shown in FIG. 16A, a conductive material may be formed in the contact hole 176 to form a bit-line contact plug BC connected to the drain region 64d and a source strapping contact plug (SC in FIG. 6) connected to the source region 64s. Since the gate pattern WL is covered by the etch stopping layer 166, the capping layer 62 is not limited as a material having an etch selectivity with respect to the interlayer dielectric layer 168.

Figure 16B:
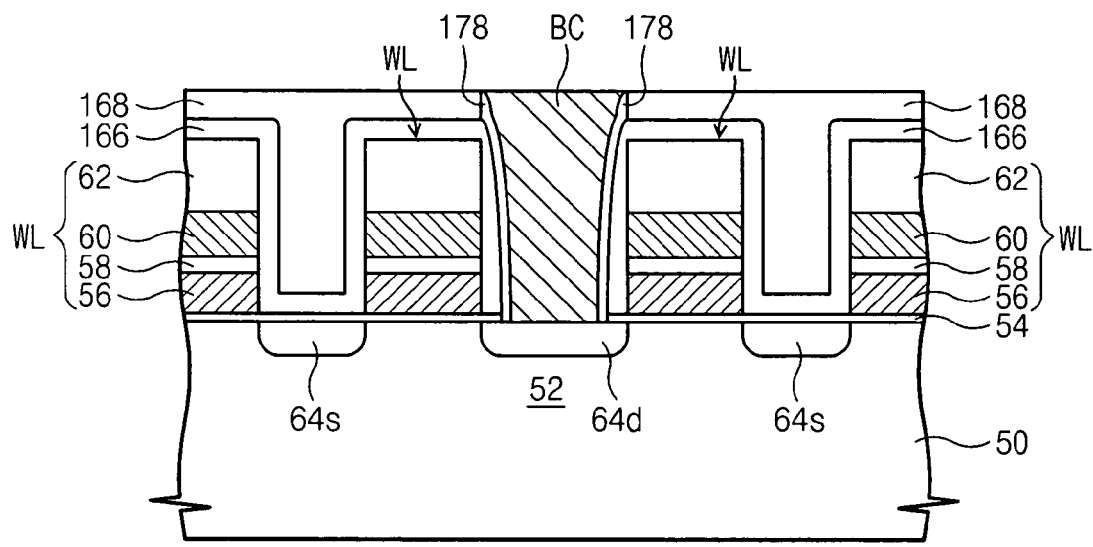
FIG. 16B is a cross-sectional view illustrating a modified example of the NOR-type flash memory device of FIG. 16A.

FIG. 16B is a cross-sectional view illustrating a modified version of the embodiment of the NOR-type flash memory device in FIG. 16A. As shown in FIG. 16B, a spacer insulation layer 178 is conformally formed to cover the etch stopping layer 166 and the active region 52 in the contact hole 176. The spacer insulation layer 178 is anisotropically etched to expose the source region of the source strapping 25 region and the drain region 64d. A conductive material may be deposited in the contact hole 176 to form the bit-line contact plug BC and the source strapping contact plug (SC in FIG. 6).

In the embodiment of FIG. 16B, the spacer insulation layer 178 may act to lower the parasitic capacitance between the plug (BC, SC) and the floating gate 56. The spacer insulation layer 178 may also reduce and/or minimize the possibility that the plug (BC, SC) is electrically shorted with the control gate electrode 60 by over etching of the etch stopping layer. The spacer insulation layer 178 may be formed of a material having an etch selectivity with respect to the interlayer dielectric layer 168 such as, for example, the same material that is used to form the etch stopping layer 166.

FIGS. 17-20 and 21A are cross-sectional views illustrating methods of forming NOR-type flash memory devices according to still further embodiments of the present invention.

Figure 17:
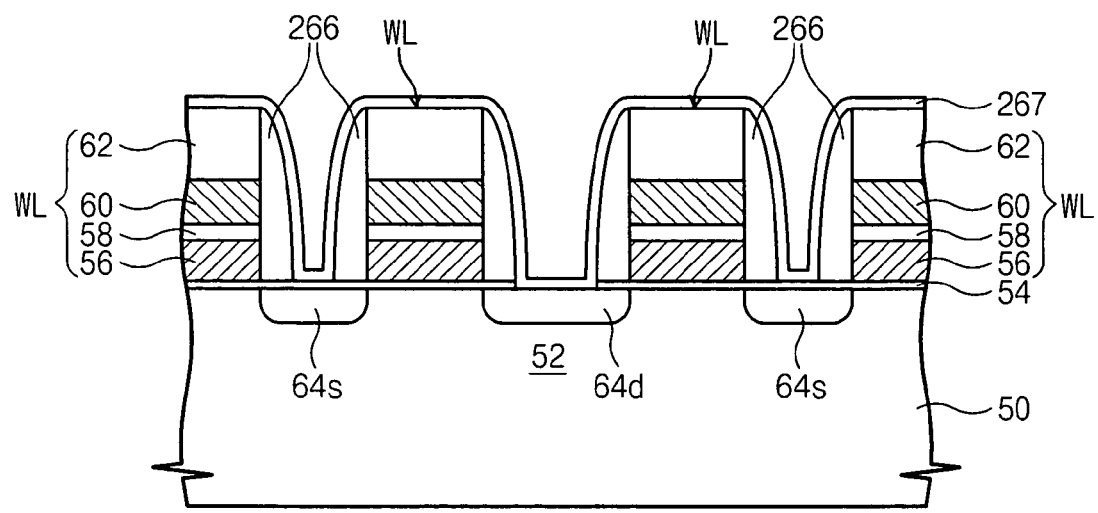
FIGS. 17-20 and 21A are cross-sectional views illustrating methods of forming contact structures for NOR-type flash memory devices according to still further embodiments of the present invention.

As shown in FIG. 17, an active region 52 is defined on a substrate 50, and a tunnel oxide layer 54 is formed on the active region 52. A plurality of gate patterns WL are formed on the tunnel oxide layer 54. The gate patterns WL may each include a floating gate 56, an inter-gate dielectric layer 58 and a control gate electrode 60. The control gate electrode 60 may cross over a plurality of the active regions 52. Each of the floating gates 56 is separated on each of the active regions 52 that are intersected with the control gate electrode 60. Impurities are implanted into the active regions 52 between the gate patterns WL to form source regions 64s and drain regions 64d. Part of a field isolation layer (not shown in FIG. 17) that is between the gate patterns WL may be removed before the impurities are implanted so that the source regions 64s may extend to be parallel to the gate patterns WL. The source regions 64s includes spaced apart source strapping regions.

Spacer patterns 266 are formed at sidewalls of the gate patterns WL. The spacer patterns 266 may be formed of a silicon oxide having a low dielectric constant. An etch stopping layer 267 is conformally formed on the gate patterns WL and the spacer patterns 266. This etch stopping layer 267 may be formed of a material having an etch selectivity with respect to the spacer pattern 266 and the interlayer dielectric layer such as, for example, silicon nitride. The etch stopping layer 267 may define a gap over the drain region 64d and the source strapping region.

Figure 18:
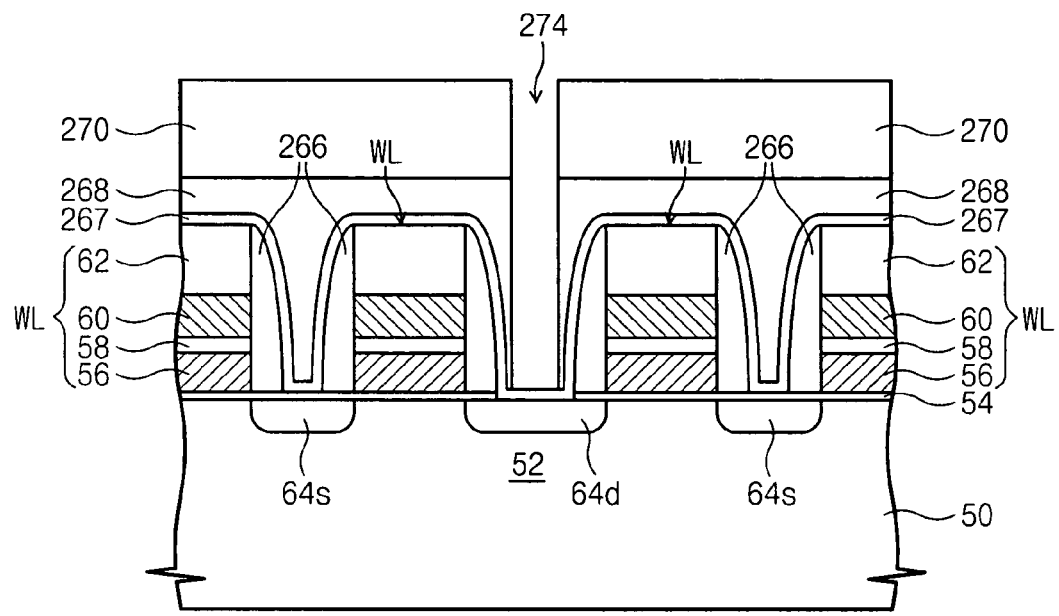

As shown in FIG. 18, a planarized interlayer dielectric layer 268 may be formed on the etch stopping layer 267. A photoresist pattern 270 defining a contact hole is formed on the interlayer dielectric layer 268. The contact hole may have a width that is smaller than the width of the gap. The interlayer dielectric layer 268 is anisotropically etched using the photoresist pattern 270 to form a preliminary contact hole 274. The interlayer dielectric layer 268 may be anisotropically etched until the etch stopping layer 267 is exposed.

Figure 19:
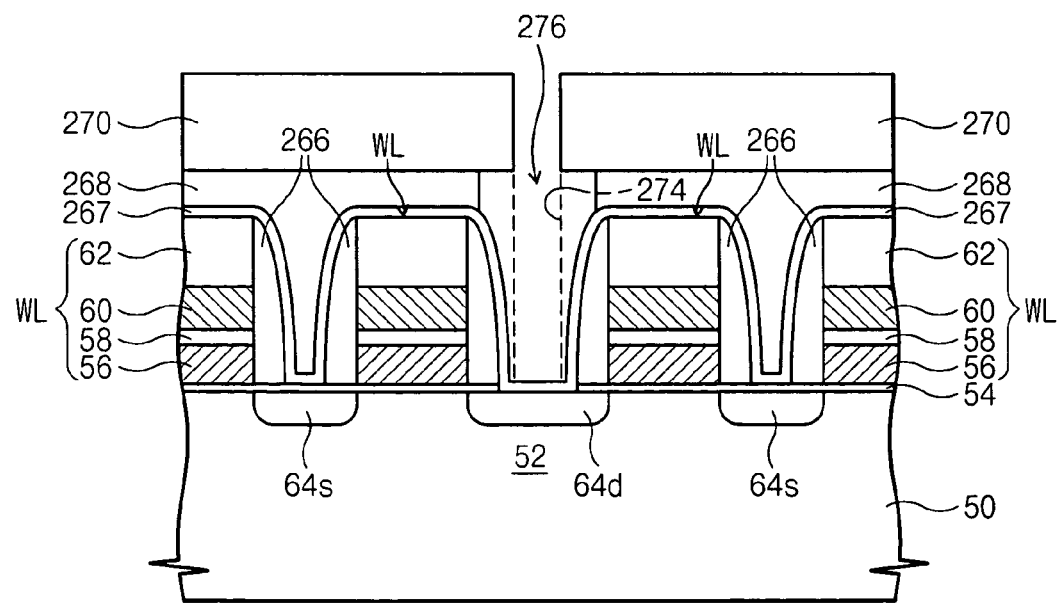

As shown in FIG. 19, the interlayer dielectric layer 268 is then isotropically etched to form a contact hole 276. During this etching, the sidewall of the preliminary contact hole 274 is recessed to expose the etch stopping layer 267 on the two facing spacer patterns 266 in the contact hole 276. Accordingly, even if the preliminary contact hole 274 was off-set due to a misalignment, the distance between the contact holes 276 and their neighboring floating gates may be made more uniform across the cell array as a result of the additional isotropic etch process. Since the parasitic capacitance between the contact plugs and the floating gates impacts the erasing operation as discussed above, the above-described embodiments of the present invention may help reduce and/or minimize the impact on the erasing operation of misalignments in the photoresist pattern used to form the contact holes.

Figure 20:
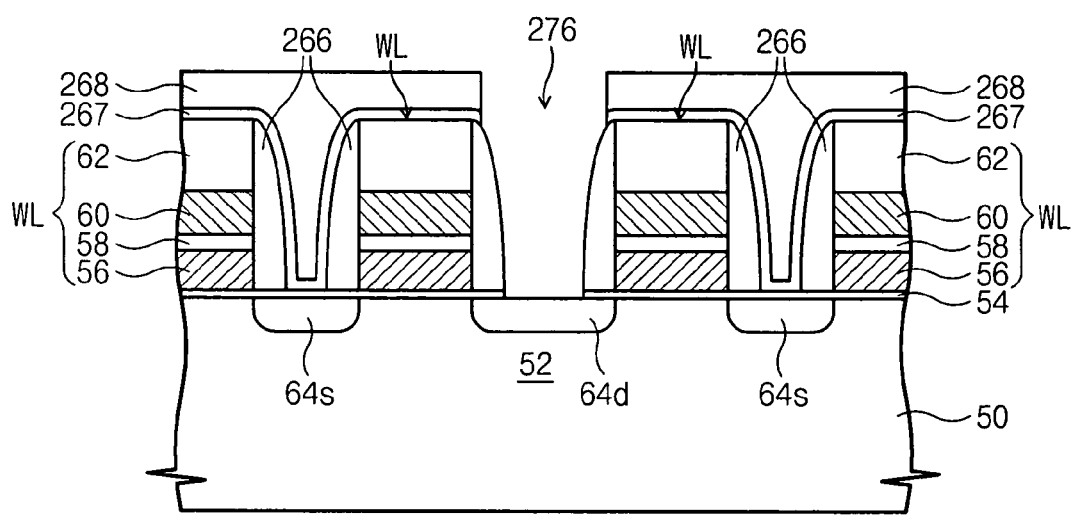

As shown in FIG. 20, the photoresist pattern 270 is removed to expose the interlayer dielectric layer 268. The etch stopping layer 267 that was exposed in the contact hole 276 is removed using the interlayer dielectric layer 268 as an etch mask. As a result, the drain region 64d is exposed. Although not illustrated, a source region of the source strapping region may be also exposed.

Figure 21A:
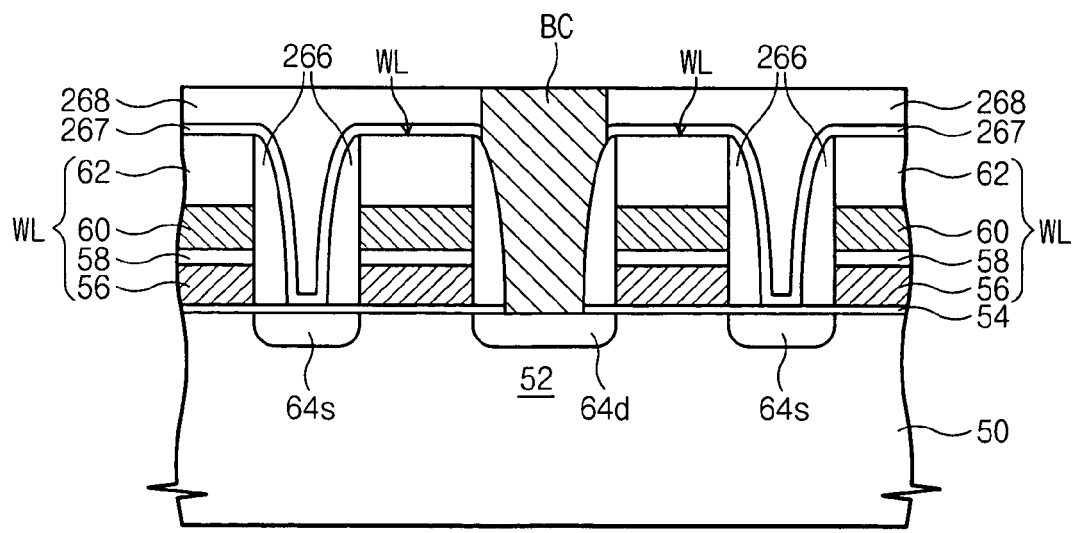

As shown in FIG. 21A, the contact hole 276 is filled with a conductive material to form a bit-line contact plug BC connected to the drain region 64d. A source strapping contact plug (SC of FIG. 6) is formed that connects to the source region 64s in the source strapping region. In this embodiment, the gap between the plug (BC, SC) and the floating gate 56 is dependent on the width of the spacer pattern 266. Since the spacer pattern 266 can have a uniform width in comparison with a patterning by a photolithography process, it may be possible to form spacer patterns having relatively uniform thicknesses throughout the cell array. Thus, even though misalignments may occur during the formation of the contact hole 276, the parasitic capacitance between the plugs (BC, SC) and the floating gates 56 may be relatively uniform throughout the cell array. The spacer pattern 266 may or may not have etch selectivity with respect to the interlayer dielectric layer 268. As such, the spacer pattern 266 may be formed, for example, of silicon oxide having a low dielectric constant. The use of a silicon oxide layer having a low dielectric constant may make it possible to reduce and/or minimize the parasitic capacitance even more. This may advantageously lower the voltage coupled to a floating gate due to a boosting of a drain plug or a source strapping contact plug, and, thus, may make it possible to reduce the time of the erasing cycle.

Figure 21B:
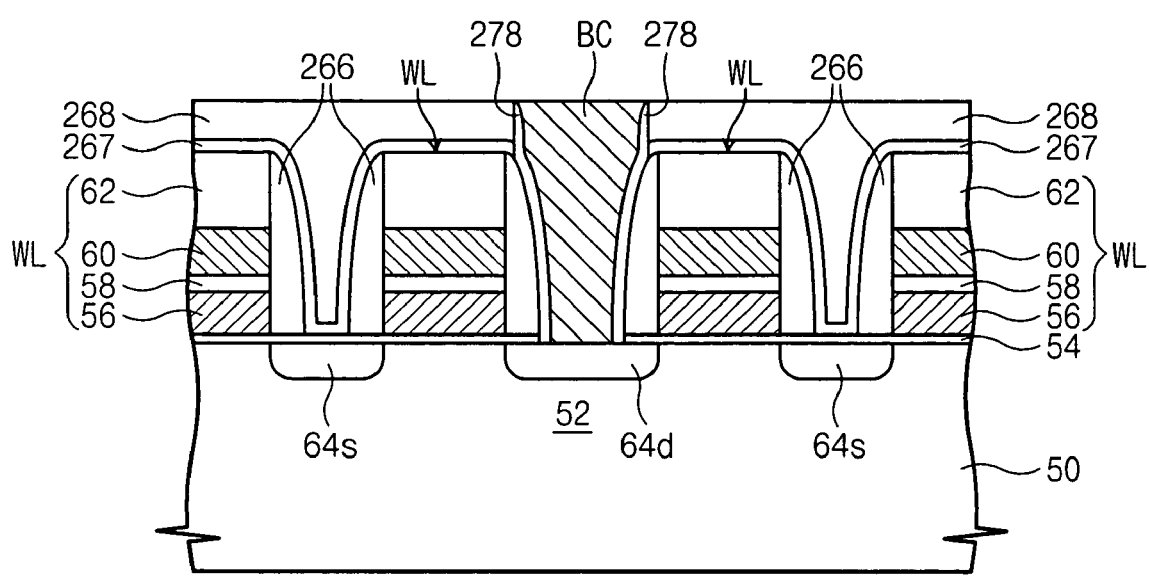
FIG. 21B is a cross-sectional view illustrating a modified example of the NOR-type flash memory device of FIG. 21A.

FIG. 21B is a cross-sectional view illustrating a modified version of the NOR-type flash memory device of FIG. 21A. As shown in FIG. 21B, after the contact hole 276 is formed, the photoresist pattern 270 is removed and a conformal spacer insulation layer 278 is formed on the device. The spacer insulation layer 278 may conformally cover the spacer pattern 266, the drain region 64d and a source region of the source strapping region in the contact hole 276. The spacer insulation layer 278 is anisotropically etched to expose the source region of the source strapping region and the drain region 64d. The spacer insulation layer 278 may remain at an inner sidewall of the contact hole 276 to cover a gate pattern WL that may be exposed by etching the spacer pattern 266.

Next, a conductive material is deposited in the contact hole 276 to form a bit-line contact plug BC that connects to the drain region 64d and a source strapping contact plug (SC of FIG. 6) that connects to the source region 64s at the source strapping region. The spacer insulation layer 278 that remains in the contact hole 276 can reduce a parasitic capacitance between the floating gate 56 and the plug (BC, SC) and can also help reduce and/or minimize the possibility that the plug (BC, SC) is shorted with the control gate electrode 60.

As described above, according to some embodiments of the present invention, a preliminary contact hole is formed by an anisotropic etch process and a contact hole is formed by an additional isotropic etch process that exposes an etch stopping layer on two facing sidewalls of neighboring gate patterns. In this manner, it is possible to make the distance between the floating gates and neighboring contact plugs more uniform through the cell array, thereby improving the uniformity of the erasing cycle, reducing erase times and/or reducing the likelihood of defects arising in memory cells due to over-erasing.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of forming a contact structure for a memory device, comprising:
    forming first and second spaced apart gate patterns on a substrate;
    forming an etch stop layer on at least a first sidewall of the first gate pattern and a second sidewall of the second gate pattern, wherein the etch stop layer on the first and second sidewalls define a gap therebetween;
    forming an interlayer dielectric layer on the etch stop layer, the interlayer dielectric layer filling the gap;
    planarizing the interlayer dielectric layer;
    anisotropically etching the interlayer dielectric layer to form a preliminary contact hole in the interlayer dielectric layer that has a width that is narrower than a width of the gap;
    isotropically etching the interlayer dielectric layer to widen the preliminary contact hole to form a contact hole, wherein the isotropic etching of the interlayer dielectric layer exposes the etch stop layer in the gap; and
    depositing a conductive material in the contact hole to form a contact plug that is electrically connected to the substrate,
    wherein a width of an upper portion of the contact hole is larger than a width of a bottom portion of the contact hole; and
    wherein the anisotropic etch of the interlayer dielectric layer that forms the preliminary contact hole does not expose the etch stop layer and wherein a width of the preliminary contact hole is narrower than the width of the gap at the bottom of the gap.

2. The method of claim 1, wherein the etch stop layer is further formed on the substrate between the first gate pattern and the second gate pattern, and wherein the method further comprises removing the etch stop layer between the first gate pattern and the second gate pattern to expose the substrate after forming the contact hole.

3. The method of claim 2, wherein removing the etch stop layer between the first gate pattern and the second gate pattern to expose the substrate comprises:
    conformally forming a spacer insulation layer of the same material as the etch stop layer on the substrate; and
    anisotropically etching the spacer insulation layer and the etch stop layer to expose the substrate under the contact hole.

4. The method of claim 2, further comprising forming a spacer insulation layer on the first and second sidewalls after formation of the contact hole.

5. The method of claim 4, wherein the etch stop layer is formed of a material having an etch selectivity with respect to the spacer insulation layer.

6. The method of claim 1, wherein forming the etch stop layer comprises:
    forming a first spacer on the first sidewall of the first gate pattern and a second spacer on the second sidewall of the second gate pattern; and
    forming an etch stop layer having an etch selectivity with respect to the first and second spacers on the first and second spacers and between the first and second spacers, and
    wherein the method further comprises removing the etch stop layer under the contact hole to expose the substrate after forming the contact hole.

7. The method of claim 6, wherein the exposing the substrate comprises:
    conformally forming a spacer insulation layer of the same material as the etch stop layer on the substrate; and
    anisotropically etching the spacer insulation layer and the etch stop layer to expose the substrate under the contact hole.

8. The method of claim 1, wherein a portion of the interlayer dielectric layer remains underneath the bottom of the preliminary contact hole, and wherein an etch mask having an opening that is narrower than the gap is used during the anisotropic etching of the interlayer dielectric layer.

9. The method of claim 8, wherein interlayer dielectric layer is directly on top of the first and second gate patterns.

10. The method of claim 9, wherein the anisotropic etch removes a first portion of the interlayer dielectric layer in the gap, and wherein the isotropic etch removes a second portion of the interlayer dielectric layer in the gap.

11. The method of claim 9, wherein the isotropic etching has a higher etch selectivity of the etch stop layer with respect to the interlayer dielectric layer than does the anisotropic etching.

12. The method of claim 11, wherein the etch stop layer forms at least part of the sidewalls of the contact hole.

13. The method of claim 12, wherein the first gate pattern comprises a tunnel oxide layer, a floating gate, an inter-gate dielectric layer and a control gate pattern that are sequentially stacked on the substrate to provide a flash memory cell.

14. The method of claim 1, wherein the etch stop layer comprises a first spacer on the first sidewall and a second spacer on the second sidewall, and wherein isotropically etching at least one sidewall of the preliminary contact hole comprises isotropically etching at least one sidewall of the preliminary contact hole to expose at least one of the first or second spacers.

15. A method of forming a contact for a memory device, the method comprising:
    forming a first gate pattern having a first sidewall and a second gate pattern having a second sidewall that opposes the first sidewall on a semiconductor substrate;
    forming a source/drain region in the semiconductor substrate between the first and second gate patterns;
    forming an etch stop layer on the first and second sidewalls, wherein the etch stop layer on the first sidewall and the etch stop layer on the second sidewall define a gap region that is located over the source/drain region;
    forming a dielectric layer in the gap region, the dielectric layer filling the gap;
    planarizing the dielectric layer;
    using an etch mask having an opening that is less than a width of the gap region to anisotropically etch the dielectric layer to form a preliminary contact hole that only partially penetrates through the dielectric layer;
    isotropically etching the sidewalls and a bottom portion of the preliminary contact hole to form the contact hole; and
    depositing a conductive material in the contact hole,
    wherein a width of an upper portion of the contact hole is larger than a width of a bottom portion of the contact hole, and
    wherein the anisotropic etch of the dielectric layer that forms the preliminary contact hole does not expose the etch stop layer, and wherein a width of the preliminary contact hole is narrower than a width of a portion of the gap region that is farthest from the etch mask.

16. The method of claim 15, wherein the isotropic etch of the preliminary contact hole exposes at least part of the etch stop layer on the first sidewall and at least part of the etch stop layer on the second sidewall.

17. The method of claim 15, wherein the width of the preliminary contact hole is less than the width of the gap region.

18. The method of claim 15, wherein the etch stop layer comprises a first spacer on the first sidewall and a second spacer on the second sidewall, and wherein the dielectric layer directly contacts a top surface of the first gate pattern and a top surface of the second gate pattern.

19. The method of claim 15, further comprising forming a first spacer on the first sidewall and a second spacer on the second sidewall, and wherein forming the etch stop layer on the first and second sidewalls comprises forming the etch stop layer on the first spacer and the second spacer.

20. The method of claim 15, further comprising forming a spacer insulation layer on the etch stop layer.

21. The method of claim 20, wherein the spacer insulation layer is formed prior to the formation of the preliminary contact hole.

22. The method of claim 20, wherein the spacer insulation layer is formed after the formation of the contact hole.

23. The method of claim 15, wherein forming the etch stop layer on the first and second sidewalls comprises conformally depositing the etch stop layer on the first and second gate patterns and the source/drain region, and wherein the etching of the dielectric layer further exposes the source/drain region.

24. The method of claim 15, wherein the isotropic etching has a higher etch selectivity of the etch stop layer with respect to the dielectric layer than does the anisotropic etching.

25. The method of claim 15, wherein anisotropically etching the dielectric layer comprises anisotropically etching a first portion of the dielectric layer in between the etch stop layer on the first sidewall and the etch stop layer on the second sidewall to form the preliminary contact hole, and wherein isotropically etching the sidewalls of the preliminary contact hole comprises isotropically etching a second portion of the dielectric layer in between the etch stop layer on the first sidewall and the etch stop layer on the second sidewall to form the contact hole.

26. The method of claim 15, wherein the etch stop layer comprises a first spacer on the first sidewall and a second spacer on the second sidewall, and wherein isotropically etching the sidewalls of the preliminary contact hole comprises isotropically etching the sidewalls of the preliminary contact hole to expose at least one of the first or second spacers.

* * * * *